US006437431B1

(12) United States Patent
Mbouombouo et al.

(10) Patent No.: US 6,437,431 B1
(45) Date of Patent: Aug. 20, 2002

(54) DIE POWER DISTRIBUTION SYSTEM

(75) Inventors: Benjamin Mbouombouo, San Jose; Sudhakar Sabada, Sunnyvale, both of CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/923,657

(22) Filed: Aug. 7, 2001

(51) Int. Cl.[7] .................... H01L 23/495; H01L 23/52
(52) U.S. Cl. ........................... 257/676; 257/691
(58) Field of Search ................ 257/207, 776, 257/691

(56) References Cited

U.S. PATENT DOCUMENTS 5,719,449 A * 2/1998 Strauss .................. 257/776
6,344,976 B1 * 2/2002 Schoenfeld et al. ...... 257/666

* cited by examiner

*Primary Examiner*—Carl Whitehead, Jr.
*Assistant Examiner*—Kiesha Rose
(74) *Attorney, Agent, or Firm*—Sawyer Law Group LLP

(57) ABSTRACT

A power distribution system for distributing external power across a die is disclosed, wherein the die has multiple sides, and a plurality of power bond pads located along each of the sides for receiving an external power signal. The system and method include patterning a plurality of straight power lines that form a single-layer power mesh diagonally across the die to connect the power bond pads that are located on two different sides of the die. As an alternative to the first embodiment, the diagonal power lines are patterned in a stair-step configuration for ease of manufacturing.

8 Claims, 2 Drawing Sheets

DIE POWER DISTRIBUTION SYSTEM

FIELD OF THE INVENTION

The present invention relates to semiconductor devices, and more particularly to a power distribution system for routing external power across a die.

BACKGROUND OF THE INVENTION

Integrated circuits are typically packaged before they are used with other components as part of a larger electronic system. Wire-bond ball grid array (BGA) packages are constructed with die mounted on a substrate with bond pads on the die connected to conductive lines or traces on the surface substrate. One area of concern for wire bond-BGA packages is power distribution to the die.

FIG. 1 is a top view of a conventional power mesh on a die for redistributing external power across the die. A conventional power mesh 10 typically comprises a series of power pads 12 evenly distributed around the periphery of the die 14, and at least two power redistribution layers of vertical and horizontal metal interconnects called power lines 16 and 18. The purpose of the power mesh 10 is to redistribute external power from the power pads 12 located around periphery of the die 14 to the center of the die 14.

The two power redistribution layers are referred to as the top redistribution layer (R) and the lower redistribution layer (R-1). Each redistribution layer includes two types of power lines 16 and 18, VDD for power and VSS for ground.

The R layer comprises a series of relatively thick power lines 16 that run either horizontally or vertically, where each connects a pair of power pads 12 located on opposite sides of the die 14. FIG. 1, for instance, shows the power lines 16 of the top R layer patterned vertically across the die 14 to connect power pads 12 located on the top and bottom sides of the die 14.

The R-1 layer below the R layer comprises a series of relatively thin power lines 18 (2.5x to 10x thinner than the R layer) that run perpendicular to the R layer to connect the power pads 12 located on the opposite two sides of the die 14.

Although the power redistribution layers effectively route power across the die 14, the current power distribution methodology fails to evenly distribute power across the power mesh 10. More specifically, the interior of the die 14 may experience a voltage drop due to the length of the power lines 16 and 18. For example, assuming that the external power source is 5 V, then the die 14 may experience a 5 V–10% drop at the center.

A related problem is that the power flow from the core of the die 14 to the power supply is not evenly distributed across all available power pads 12. The wide R layer has little resistance and therefore carries more current, while the thinner R-1 layer has a higher resistance and therefore carries less current. This may result in electromigration issues for the power pads 12 connected to the R layer, since they tend to drive more current than the power pads 12 connected on the R-1 layer. Trying to resolve the electromigration issue by adding more pads on the sides connected by the R layer will also result into an asymmetry of the distribution of the pads. For example the sides connected by the R layer may have far less signal pads than the side connected by the R-1 layer, just because most of the VDD/NSS pads will be on side supported by the R-layer.

A third problem with the current power distribution methodology is that the power mesh 10 requires at least two metal layers, R and R-1. Unfortunately, the R-1 layer is a routing resource that could be used for signal routing rather than power routing, which could result in smaller die 14 sizes.

Accordingly, what is needed is an approved power mesh that achieves symmetry in power distribution both within the die and through the power pads. The power pads should also be evenly distributed along the chip sides. The present invention addresses such a need.

SUMMARY OF THE INVENTION

The present invention provides a system and method for distributing external power across a die. The die has multiple sides and a plurality of power bond pads located along each of the sides for receiving an external power signal. The system and method include patterning a plurality of straight power lines that form a single-layer power mesh diagonally across the die to connect power the bond pads that are located on two different sides of the die. As an alternative to the first embodiment, the diagonal power lines are patterned in a stair-step configuration for ease of manufacturing.

According to the method system disclosed herein, because the power lines are routed diagonally across the die, all the power bond pads can be connected without the need for a second layer, thereby providing a single-layer power mesh. The single-layer power mesh of the present invention achieves symmetry in power distribution both within the die and an even distribution of current flow through the power pads. In addition, the single-layer power mesh frees a routing resource for signal routing, and this results into a significant die size decrease.

DETAILED DESCRIPTION

The present invention relates to providing a power mesh for redistributing external power across a die. The following description is presented to enable one of ordinary skill in the art to make and use the invention and is provided in the context of a patent application and its requirements. Various modifications to the preferred embodiments and the generic principles and features described herein will be readily apparent to those skilled in the art. Thus, the present invention is not intended to be limited to the embodiments shown but is to be accorded the widest scope consistent with the principles and features described herein.

The present invention comprises using only one layer, preferably the R layer for a power mesh, while achieving an even distribution of the current flow through the power pads and also freeing layers beneath the R layer as a routing resource. Rather than providing the power mesh as a two perpendicular layers of power lines connected between bond pads on opposite sides of the die, the power mesh of the, present invention routes power lines diagonally across the die in relation to the sides of the die to interconnect the die's power bond pads.

Because the power lines are routed diagonally across the die, all the power bond pads can be connected without the need for a second layer. There are two embodiments for the single-layer, diagonal power mesh. In one preferred embodiment, straight power lines diagonally connect power pads that are located on two different sides of the die. As an alternative to the first embodiment, the diagonal power lines are patterned in a stair-step configuration for ease of manufacturing.

Figure 1:
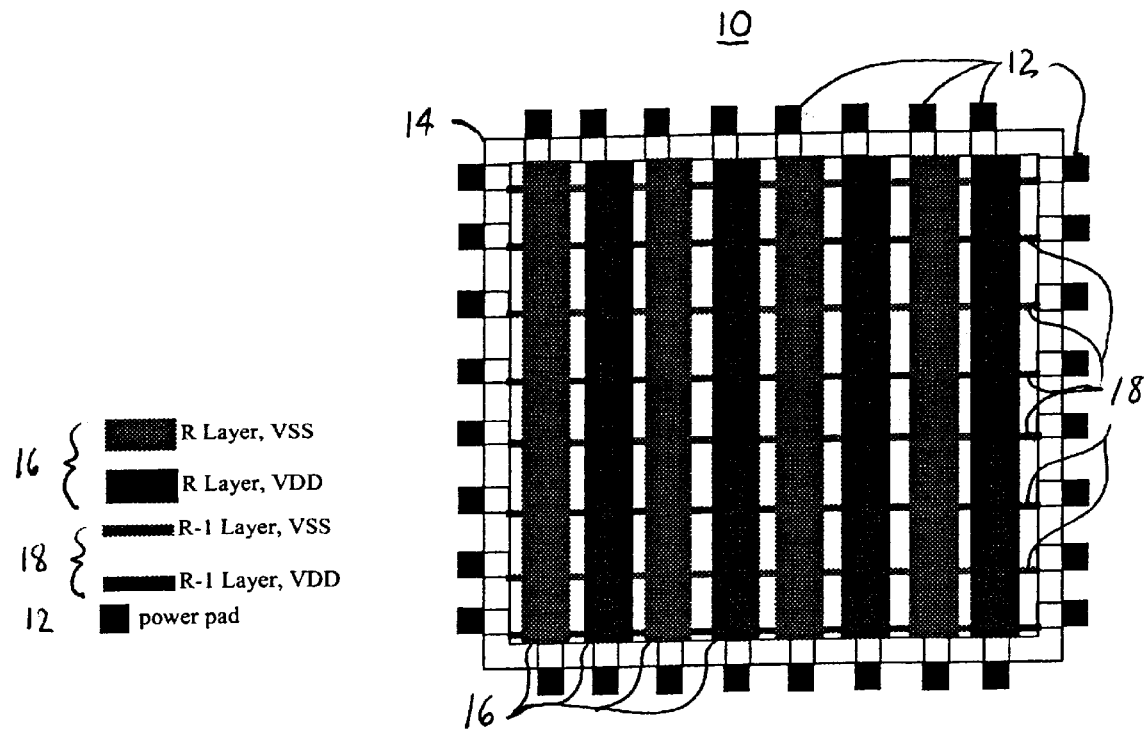
FIG. 1 is a top view of a conventional power mesh on a die for redistributing external power across the die.
Figure 2:
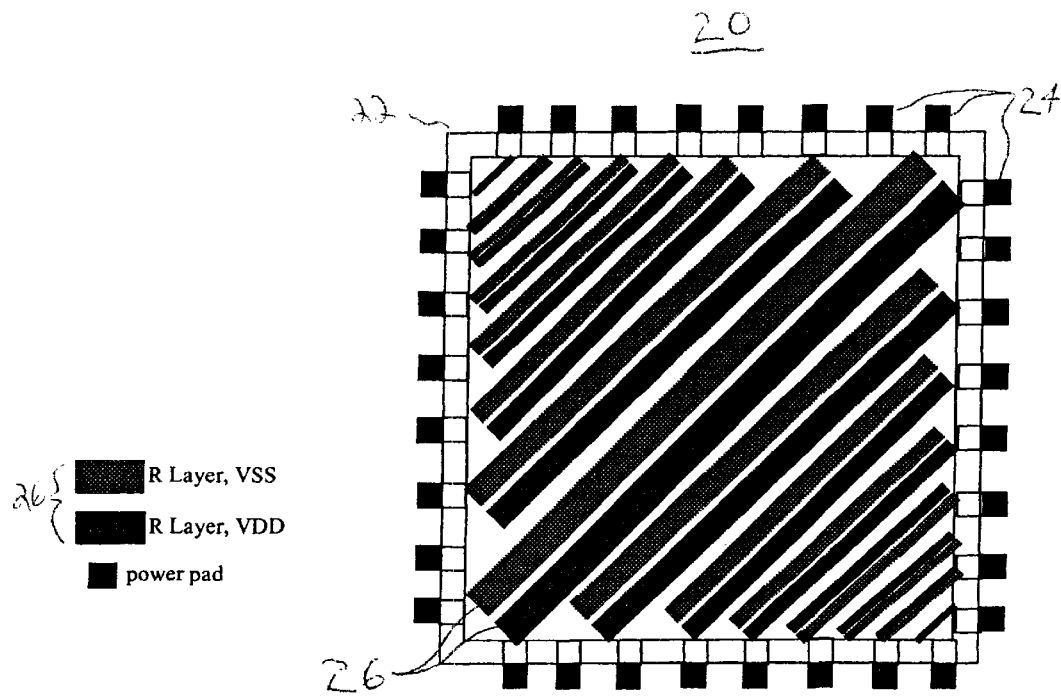
FIG. 2 is a top view of a power mesh for redistributing external power across a die in accordance with the first preferred embodiment of the present invention.

Referring now to FIG. 2, a top view of a power mesh for redistributing external power across a die 22 is shown in accordance with the first preferred embodiment of the present invention. The die 22 is shown having four-sides and a plurality of power bond pads 24 located along the periphery of each of the sides.

The present invention achieves a single-layer power mesh 20 by routing straight power lines 26 diagonally across the die 22 between respective pairs of power bond pads 24, which are located on two different sides of the die 22. In a preferred embodiment, the width of the power lines 26 is varied depending on the length of each of the power lines 26. The maximum width is the center power line, and the widths of the other power lines 26 decrease with increasing distance from the center power line to the periphery of the die 22.

Assuming a constant current distribution on the die 22, the center power line 26 will have to support more current than the power lines 26 away from the center due to its length. Consequently, there should be higher concentration of power pads 24 in the corners of the die 22 where the center power lines 26 connect. This is design friendly since signal pads can not be placed at the corner anyway, a high number of power pads will be placed at the corners, this will free more space for signal pads on the sides.

According to the present invention, the width of each power line 26 is driven by a predetermined voltage drop limit. First, the die 22 is divided into sections, where each section is supported by one power line. A voltage drop limit is then determined for each section based on the number of gates in that section. The width of each power line is then determined so that at the center of each power line, the voltage drop meets the predetermined limit. The center power line is the widest because it covers more gates and will therefore be wide enough to guarantee the given voltage drop limit and the electromigration limit. At the same time, the total current coming from the gates covered by the center line is used to determine the number of power pads 24 needed to be connected to the center line.

Figure 3:
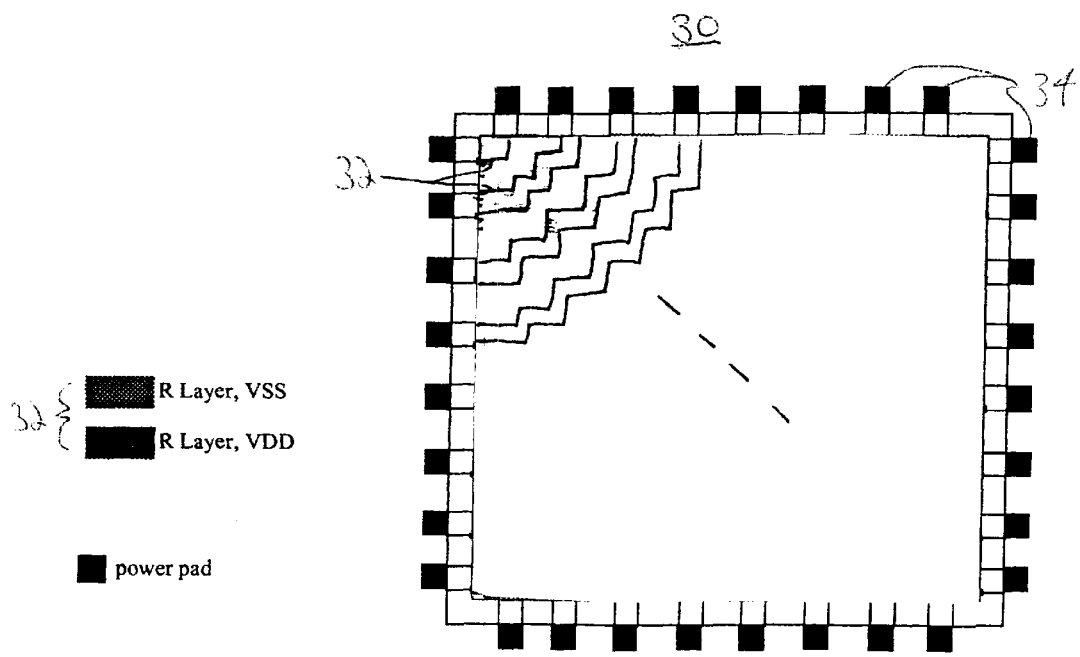
FIG. 3 is a top view of a power mesh in accordance with a second preferred embodiment of the present invention.

Some type of fabrication tools may be incapable of patterning straight-line diagonal metal layers. Therefore, as shown in FIG. 3, the second preferred embodiment of the present invention provides a single-layer diagonal power mesh 30 that routes the power lines 32 in a stair-step arrangement to connect the power pads 34 on different sides of the die.

The power meshes of the present invention will achieve an even distribution of the current flow over the power pads and avoid potential electromigration issues. Also, because the power lines are routed diagonally, the power meshes require only one layer of metal to connect all the power bond pads. Since the layer underneath the R layer is no longer used for the power mesh, an additional routing resource will be freed for chip level routing. In conventional two-layer power mesh designs, up to 20% of the R-1 layer is used to support the power mesh and the rest of that layer (80%) is used for signal routing. In the present invention, this same amount is freed for signal routing, resulting in a die size reduction.

Other alternate embodiments for achieving an even current distribution flow through the power pads include providing identical 2-layers at the top. However, assuming that this layer is the R layer, this would waste a significant routing resource. Another alternative is to keep the current metal stacks, with a thick R layer and a thinner layer underneath. For the power mesh, there should be enough metal for the layer underneath the R layer in order to achieve this same mesh resistance for the 2 top layers. However, this approach will cost a lot of routing resource for the layer underneath the R layer.

A power distribution method and system has been disclosed. The present invention has been described in accordance with the embodiments shown, and one of ordinary skill in the art will readily recognize that there could be variations to the embodiments, and any variations would be within the spirit and scope of the present invention. For example, although the method for isolating noise present invention has been described in terms of wire-bond packaging, the present invention can be used for other types of packaging that have multi-layer power meshes and asymmetrical power distribution. Accordingly, many modifications may be made by one of ordinary skill in the art without departing from the spirit and scope of the appended claims.

We claim:

1. A power distribution system, comprising:

a die having multiple sides;

a plurality of power bond pads located along each of the sides, the power bond pads for receiving an external power signal; and a plurality of straight power lines forming a single-layer power mesh patterned diagonally across the die to connect the power bond pads that are located on two different sides of the die, wherein the width of each of the power lines is dependent on length of the power line.

2. The power distribution system of claim 1 wherein the diagonal power lines are patterned in a stair-step configuration.

3. The power distribution system of claim 1 wherein a center power line has a maximum width, and the widths of the other power lines decrease with increasing distance from the center power line to the die's periphery.

4. The power distribution system of claim 3 wherein each of the power lines is wide enough to meet a predetermined voltage drop limit.

5. The power distribution system of claim 4 wherein the predetermined voltage limit is determined by dividing the die into sections, where each section is supported by one power line, determining a voltage drop limit for each section based on the number of gates in that section, and determining a width of each power line so that a center of each power line, the voltage drop meets the predetermined voltage limit.

6. The power distribution system of claim 5 wherein the total current coming from gates covered by the center line is used to determine the number of power bond pads needed to be connected to the center line.

7. A power distribution system, comprising:

a die having multiple sides;

a plurality of power bond pads located along each of the sides, the power bond pads for receiving an external power signal; and a plurality of straight power lines forming a single-layer power mesh patterned diagonally between respective power bond pads that are located on two different sides of the die, wherein the width of each of the power lines is dependent on length of the power line.

8. A power distribution system, comprising:

a die having multiple sides;

a plurality of power bond pads located along each of the sides, the power bond pads for receiving an external power signal; and a plurality of stair-stepped power-lines forming a single-layer power mesh patterned diagonally between respective power bond pads that are located on two different sides of the die, wherein the width of each of the power lines is dependent on length of the power line.

* * * * *